United States Patent
McClain et al.

(10) Patent No.: US 7,527,155 B2
(45) Date of Patent: May 5, 2009

(54) APPARATUS AND SYSTEM FOR VERTICALLY STORING COMPUTING DEVICES

(75) Inventors: Brian Robert McClain, Tucson, AZ (US); David Todd Nay, Raleigh, NC (US); William Vigilante, Jr., Lititz, PA (US)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 10/776,943

(22) Filed: Feb. 11, 2004

(65) Prior Publication Data

US 2005/0173357 A1 Aug. 11, 2005

(51) Int. Cl.
*A47F 7/00* (2006.01)
(52) U.S. Cl. .................. 211/26; 211/126.2; 312/223.1; 361/724
(58) Field of Classification Search .................. 211/26, 211/126.2; 312/223.1, 223.2, 223.3, 334.1, 312/28, 265.1; 361/183, 683, 680, 681, 686, 361/724, 809
See application file for complete search history.

(56) References Cited

U.S. PATENT DOCUMENTS

| | | | | |
|---|---|---|---|---|
| 2,588,163 A * | 3/1952 | Ristenpart et al. ............. 312/27 |
| 2,812,067 A * | 11/1957 | Gussack ...................... 211/46 |
| 4,180,298 A * | 12/1979 | Borgerson, Jr. ............. 312/242 |
| 4,854,538 A * | 8/1989 | Von Schalscha ....... 248/346.03 |
| 5,177,665 A * | 1/1993 | Frank et al. .................. 361/683 |
| 5,206,790 A | 4/1993 | Thomas et al. .............. 361/380 |
| 5,278,729 A | 1/1994 | Hoffman ..................... 361/809 |
| 5,537,290 A * | 7/1996 | Brown et al. ................. 361/681 |
| 5,588,259 A * | 12/1996 | Kolefas ........................ 49/394 |
| 5,673,169 A * | 9/1997 | Wicks ......................... 361/680 |
| 5,751,548 A * | 5/1998 | Hall et al. .................... 361/686 |
| 5,799,917 A * | 9/1998 | Li ............................. 248/284.1 |
| 5,973,917 A | 10/1999 | Whte .......................... 361/683 |
| 6,061,966 A * | 5/2000 | Nelson et al. ................. 49/394 |
| 6,076,905 A * | 6/2000 | Wilson ..................... 312/223.2 |
| 6,279,761 B1 * | 8/2001 | Niewiadomski et al. . 211/94.01 |
| 6,283,429 B1 * | 9/2001 | Markovich et al. ....... 248/286.1 |
| 6,286,794 B1 * | 9/2001 | Harbin .................... 248/123.2 |
| 6,386,120 B1 * | 5/2002 | Nelson et al. ............... 108/134 |
| 6,504,707 B2 * | 1/2003 | Agata et al. ................. 361/681 |
| 6,554,142 B2 * | 4/2003 | Gray ........................... 211/26 |
| 6,561,349 B2 * | 5/2003 | Lee ............................ 206/320 |
| 6,621,692 B1 * | 9/2003 | Johnson et al. ............. 361/683 |
| 6,739,096 B2 * | 5/2004 | Feldpausch et al. .......... 52/36.1 |
| 6,783,105 B2 * | 8/2004 | Oddsen, Jr. ............... 248/279.1 |
| 6,796,536 B1 * | 9/2004 | Sevier, IV ................. 248/121 |
| 6,842,334 B2 * | 1/2005 | Smith et al. ................. 361/681 |
| 6,892,650 B2 * | 5/2005 | Baloga et al. ............ 108/50.01 |
| 6,945,412 B2 * | 9/2005 | Felcman et al. ............... 211/26 |
| 7,048,242 B2 * | 5/2006 | Oddsen, Jr. ............ 248/280.11 |
| 7,133,289 B2 * | 11/2006 | Arippol ...................... 361/724 |

\* cited by examiner

*Primary Examiner*—James Kramer
*Assistant Examiner*—Jared W. Newton
(74) *Attorney, Agent, or Firm*—Kunzler & McKenzie

(57) ABSTRACT

An apparatus and system are provided for vertically storing computing devices. The present invention conserves horizontal space in a rack mount frame by supporting an I/O service terminal station requiring substantially no horizontal storage space. The present invention includes at least one support connected to a mounting mechanism to permit the I/O devices or I/O service terminal stations to transition between an access position and a vertical storage position. Furthermore, the present invention allows a user to adjust or position the I/O devices in a variety of positions to accommodate the user.

13 Claims, 9 Drawing Sheets

APPARATUS AND SYSTEM FOR VERTICALLY STORING COMPUTING DEVICES

BACKGROUND OF THE INVENTION

1. Field of the Invention

The invention relates to computer equipment environments. Specifically, the invention relates to apparatus, systems, and methods for mounting and/or storing computing devices such as an I/O terminal.

2. Description of the Related Art

Generally, computer systems administrators and other computer operators store a variety of computer equipment, such as servers, switches, disk drives, patch panels, and the like, in rack mount frames 100. FIG. 1 illustrates one embodiment of a rack mount frame 100. Typically, a rack mount frame 100 includes a plurality of frame members 102 that support computer equipment 104 stored within the frame 100. A user typically bolts the computer equipment 104 horizontally to the frame members 102 and stacks the computer equipment 104 vertically within the frame 100. Generally, the user accesses the computer equipment 104 from the front or face 106 of the frame 100; or if the need arises, the user also may access the equipment 104 from the back 108.

The computer equipment 104 is generally measured in units of measure known as 'U' (1U=44.45 mm or 1.75 in.). The 'U' refers to the vertical space the computer equipment 104 will occupy. Consequently, frames 100 are typically configured with holes to accommodate computer equipment 104 of various 'U' sizes. A frame 100 supports a finite number of 'U's vertically. In addition, frames 100 taller than about 6' may not allow for practical use of computer equipment 104 installed above about 6'.

In many cases, rack mount frames 100 are stored within a cabinet (not shown). Cabinet doors open or close to control access to the face 106 or back 108 of the frame 100. Hence, a storage cabinet may provide one form of security to protect the computer equipment 104 from unauthorized use. In addition, rack mount frames 100 are often stored in locked rooms.

Unfortunately, problems arise as computer equipment 104 is added to a frame 100. Horizontal storage space is limited to the space along the frame members 102, which is typically measured in U's. As a result, a rack mount frame 100 may be filled to capacity by relatively few computer equipment components 104. Or, if a frame 100 is encased within a cabinet, the cabinet limits the available storage area as well.

Consequently, horizontal storage space is a premium. Once the horizontal storage space is occupied, a user must provide another way or another frame 100 to store additional computer equipment 104. Also, frames 100 may be pre-designed, or configured to store certain computer equipment 104 as part of a larger complete system, thus limiting the possibilities for storing additional equipment 104. Moreover, computer equipment 104 may occupy extra vertical space in order to provide adequate cooling. As a result, a rack mount frame 100 may quickly fill with computer equipment 104.

As part of the computer equipment 104, the frames 100 generally include at least one Input/Output service terminal station. An I/O terminal may comprise any set of components, or I/O devices, that allow a user to interface with the other computer equipment 104. The I/O service terminal stations are generally connected horizontally to the frame members 102, like the other computer equipment 104, and often comprise a tray that slides in and out on a horizontal plane, similar to a conventional drawer. Typically, the user pulls out an I/O service terminal station to interact with the computer equipment 104. When the station is open, the I/O devices are in an access position and the user can interface with the other computer equipment 104. When the station is pushed into the frame 100, the I/O devices are in a horizontal storage position. Thus, the user must pull out the I/O service terminal to an access position in order to access the I/O devices.

A typical I/O service terminal occupies about 1U or more of horizontal storage space within a frame 100. The height itself is relatively insignificant compared to the height of the overall frame 100. However, the 1U height becomes important when a frame 100 is filled to capacity. For example, a frame 100 may be filled except for a 3U area within the frame 100. The user may have to choose between installing a 3U server or a 1U I/O service terminal station. In order to interface with the computer equipment 104, the user must install the 1U I/O terminal, leaving 2U of horizontal storage space unoccupied within the frame 100. Furthermore, the 3U server must be stored in an alternative location. Consequently, storing the I/O service terminal station within the frame 100 wastes valuable horizontal storage space.

Moreover, storing the I/O service terminal station within the frame 100 causes additional problems for a user. As mentioned previously, conventional I/O service terminal stations are semi-permanently fixed to the frame members 102. As a result, the height of the I/O devices in the I/O service terminal stations is fixed. For example, an I/O terminal may be installed at about two-thirds of the height of a frame 100 so an average user may access the computer equipment 104 from a standing position. However, if the user is short or disabled, he/she cannot access the I/O service terminal. Also, if prolonged use of the I/O service terminal station is required, a user may tire and wish to work from a seated position.

Alternatively, the I/O service terminal station may be connected at a lower height to allow a user to interact with the computer equipment 104 from a seated position. Consequently, a user must work from a chair, or must crouch to access the I/O service terminal station, which may be troublesome, especially if quick access to the systems is all that is required. Furthermore, in some cases, the I/O service terminal station may be placed in a middle position to prevent the I/O devices from being too high or too low. Unfortunately, a middle position poorly accommodates both those who prefer a lower position and those who prefer a higher position. Plus, the I/O terminal may not be wheelchair accessible.

Accordingly, what is needed is an apparatus and a system for vertically storing I/O devices, especially in a computer rack environment, such that I/O devices do not occupy the limited horizontal storage space within the frames 100. In this manner, horizontal storage space in a rack mount frame 100 is available for additional computer equipment 104. Furthermore, the apparatus and system should provide a mounting mechanism to permit the I/O devices and/or I/O service terminal station to transition between an access position and a vertical storage position. The apparatus and system should also be vertically adjustable. In addition, the apparatus and system should be suitable for vertically storing other types of computing devices as well.

BRIEF SUMMARY OF THE INVENTION

The present invention has been developed in response to the present state of the art, and in particular, in response to the problems and needs in the art that have not yet been met for storing computing devices in a computer rack environment. Accordingly, the present invention has been developed to provide an apparatus and system for vertically storing computing devices that overcome many or all of the above-discussed shortcomings in the art.

An apparatus according to the present invention includes an upper support for receiving a first computing device and a mounting mechanism that allows the upper support to transition between an access position and a vertical storage position. In certain embodiments, the apparatus may also provide a lower support for receiving a second computing device and a mounting mechanism that connects the upper support to the lower support and allows the upper support and the lower support to transition between an access position and a vertical storage position. The first computing device may comprise a display device, while the second computing device may comprise a human input device. Alternatively, the first computing device may comprise a combined display device & human input device.

In certain embodiments, the mounting mechanism pivotally connects the upper support to the lower support. In addition, the mounting mechanism may be configured to slide the upper support and lower support between the access position and the vertical storage position. In alternative embodiments, the mounting mechanism may be configured to pivot the upper and lower support between the access position and the vertical storage position. The access position may comprise the upper support or lower support at least partially in a non-vertical orientation.

The present invention may also comprise a rack mount frame having a face. The mounting mechanism may connect to the rack mount frame such that the vertical storage position places the upper support and lower support behind the face and the access position places the upper support and lower support in front of the support structure face. Alternatively, the mounting mechanism may allow the upper and lower supports to be vertically stored and accessed parallel to the face of the support structure. The apparatus may also comprise a vertical adjustment mechanism configured to allow the upper support and lower support to be vertically adjusted to a plurality of vertical positions.

A system of the present invention is provided for vertically storing an I/O terminal presentable for use in a horizontal position. The system includes a rack mount frame configured to house horizontally mounted computer equipment, an I/O terminal comprising a flat display pivotally connected to a keyboard such that the keyboard pivots between a substantially vertical position and a non-vertical position, and a mounting mechanism configured to mount the I/O terminal to the rack mount frame. The mounting mechanism is preferably configured such that the I/O terminal is movable between a substantially vertical storage position and an access position. The access position may comprise at least the keyboard of the I/O terminal in a non-vertical position. Additionally, the system may comprise a cabinet that encloses the rack mount frame and the I/O terminal when the I/O terminal is in the vertical storage position. Also, a vertical adjustment mechanism may be configured to connect the I/O terminal to the rack mount frame such that a user may adjust the height of the I/O terminal.

The mounting mechanism of the system of the present invention may comprise a mounting bracket connectable to the rack mount frame and a hinge connecting the mounting bracket to the I/O terminal such that closing the hinge positions the I/O terminal in the vertical storage position and opening the hinge positions the I/O terminal in the access position. In certain embodiments, the mounting mechanism may comprise a telescoping member connected to the I/O terminal and configured to position the I/O terminal in the access position when extended and in the vertical storage position when retracted.

In an alternative embodiment, the mounting mechanism may comprise a mounting bracket and a rail connected to the I/O terminal. The rail may be slidably connected to the mounting bracket such that extending the rail with respect to the mounting bracket positions the I/O terminal in front of the rack mount frame and retracting the rail positions the I/O terminal in the vertical storage position.

The features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

It will be readily understood that the components of the present invention, as generally described and illustrated in the figures herein, may be arranged and designed in a wide variety of different configurations. Thus, the following more detailed description of the embodiments of the apparatus and system of the present invention, as represented in FIGS. 1 through 4C, is not intended to limit the scope of the invention, as claimed, but is merely representative of selected embodiments of the invention.

Reference throughout this specification to "a select embodiment," "one embodiment," or "an embodiment" means that a particular feature, structure, or characteristic described in connection with the embodiment is included in at least one embodiment of the present invention. Thus, appearances of the phrases "a select embodiment," "in one embodiment," or "in an embodiment" in various places throughout this specification are not necessarily all referring to the same embodiment.

Furthermore, the described features, structures, or characteristics may be combined in any suitable manner in one or more embodiments. In the following description, numerous specific details are included to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

The illustrated embodiments of the invention will be best understood by reference to the drawings, wherein like parts are designated by like numerals throughout. The following description is intended only by way of example, and simply illustrates certain selected embodiments of devices, systems, and processes that are consistent with the invention as claimed herein.

Figure 1:
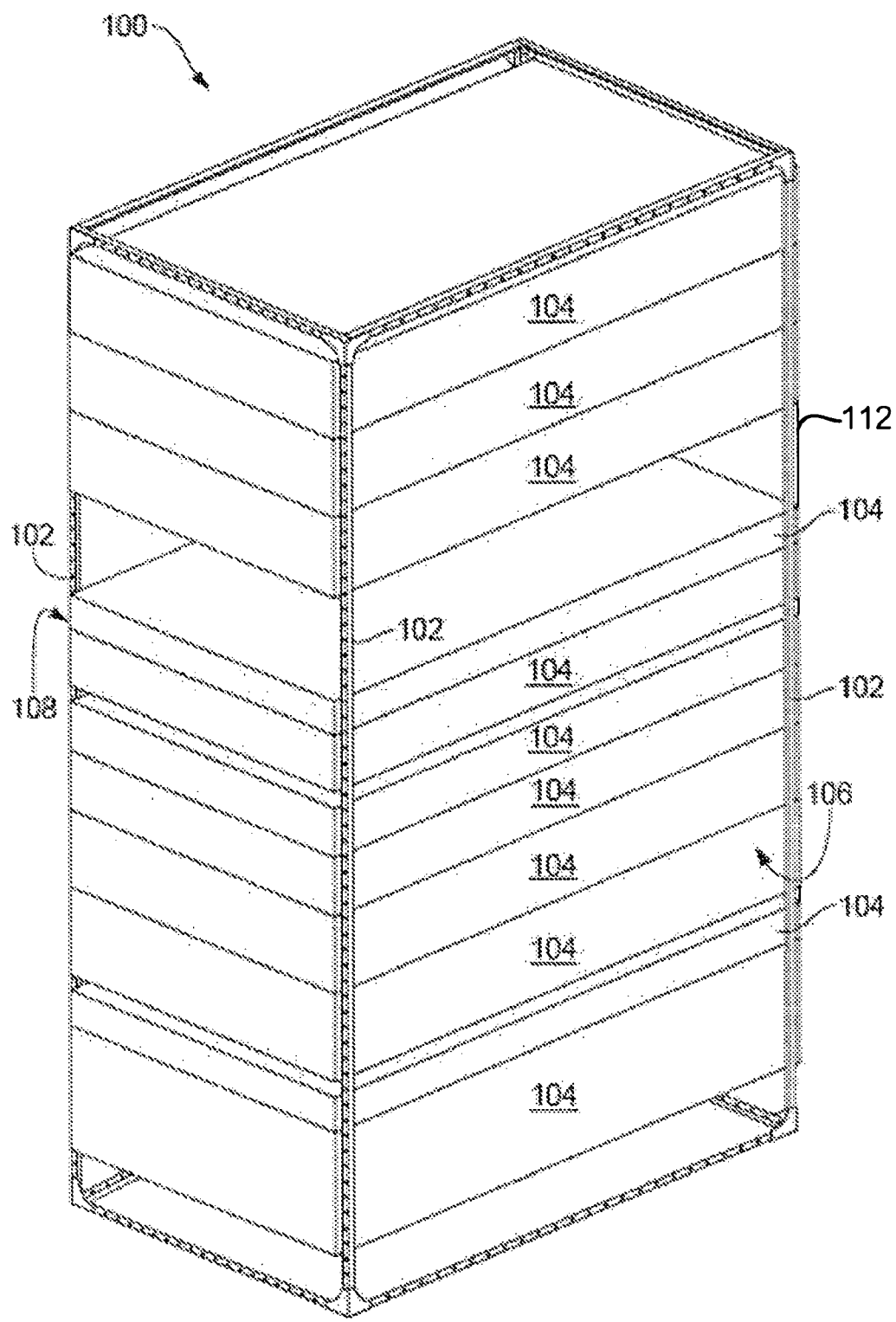
FIG. 1 is a perspective view illustrating a conventional rack mount frame suitable for use with embodiments of the present invention.
Figure 2A:
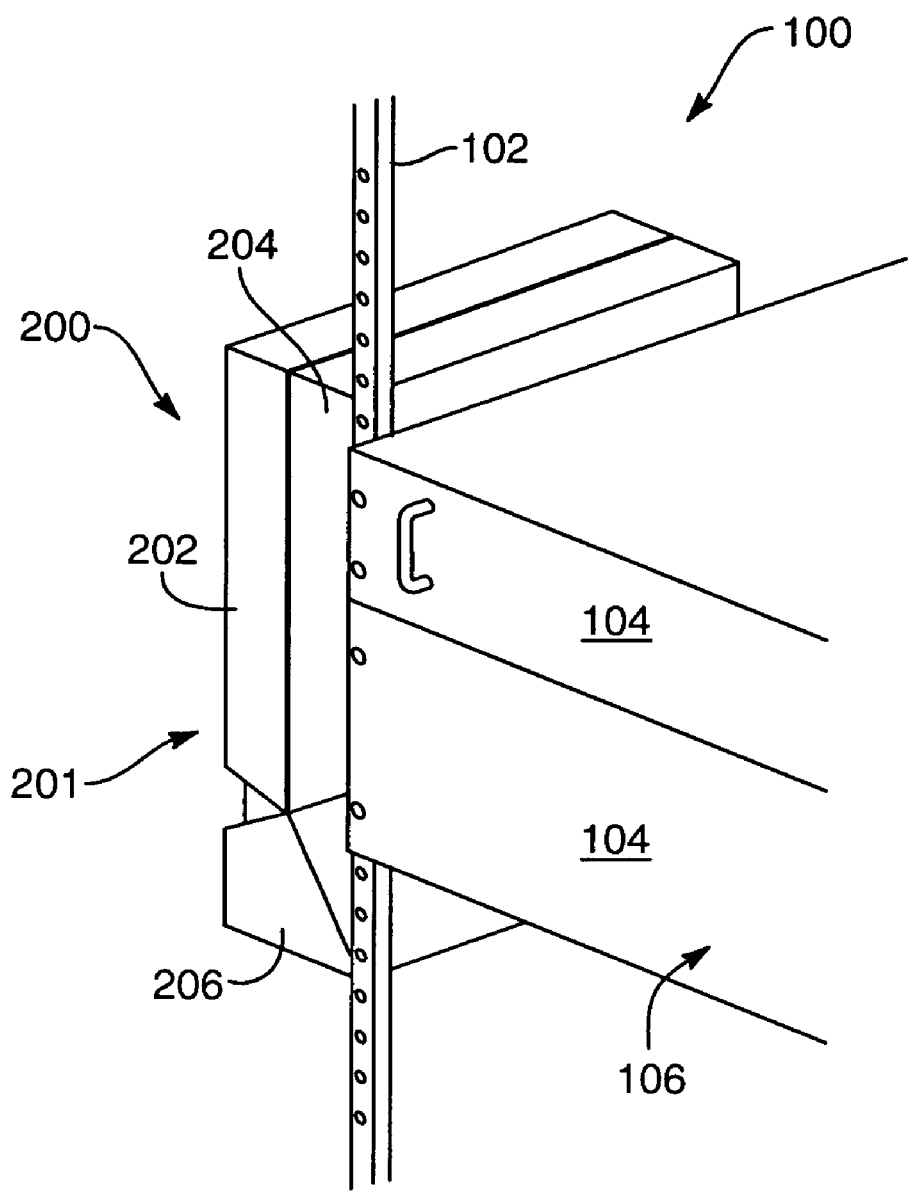
FIG. 2A is a perspective view illustrating one embodiment of an I/O service terminal station in a vertical storage position.

As mentioned previously, the present invention compactly stores computing devices in a vertical storage position to conserve horizontal space within a rack mount frame 100 (See FIG. 1). The computing devices may comprise I/O devices. FIG. 2A illustrates one embodiment of an I/O terminal 200 for vertically storing I/O devices. An I/O terminal 200 may comprise any set of components that can be used by a user to interact with a computer. In the depicted embodiment, the I/O terminal 200 is in a vertical storage position 201.

The vertical storage position 201 places the I/O devices in a vertical position substantially perpendicular to the other computer equipment 104 that is horizontally stored within a rack mount frame 100. Preferably, the vertical storage position 201 is outside of the horizontal storage space available within the rack mount frame 100. Consequently, the I/O terminal 200 does not occupy valuable space available for storing computer equipment 104 within the frame 100. In certain embodiments, the frame 100 may further include a cabinet (not shown) to enclose the frame members 102 and the I/O terminal 200 containing I/O devices when the I/O terminal 200 is in the vertical storage position 201.

In one embodiment, an I/O terminal 200 may comprise an upper support 202, a lower support 204, and a mounting mechanism 206. The upper support 202 may be adjacent to a lower support 204 in the vertical storage position 201. In one embodiment, the upper support 202 comprises a tray or a retaining device configured to receive a first I/O device 208, such as a display device (See FIG. 2C).

Figure 2B:
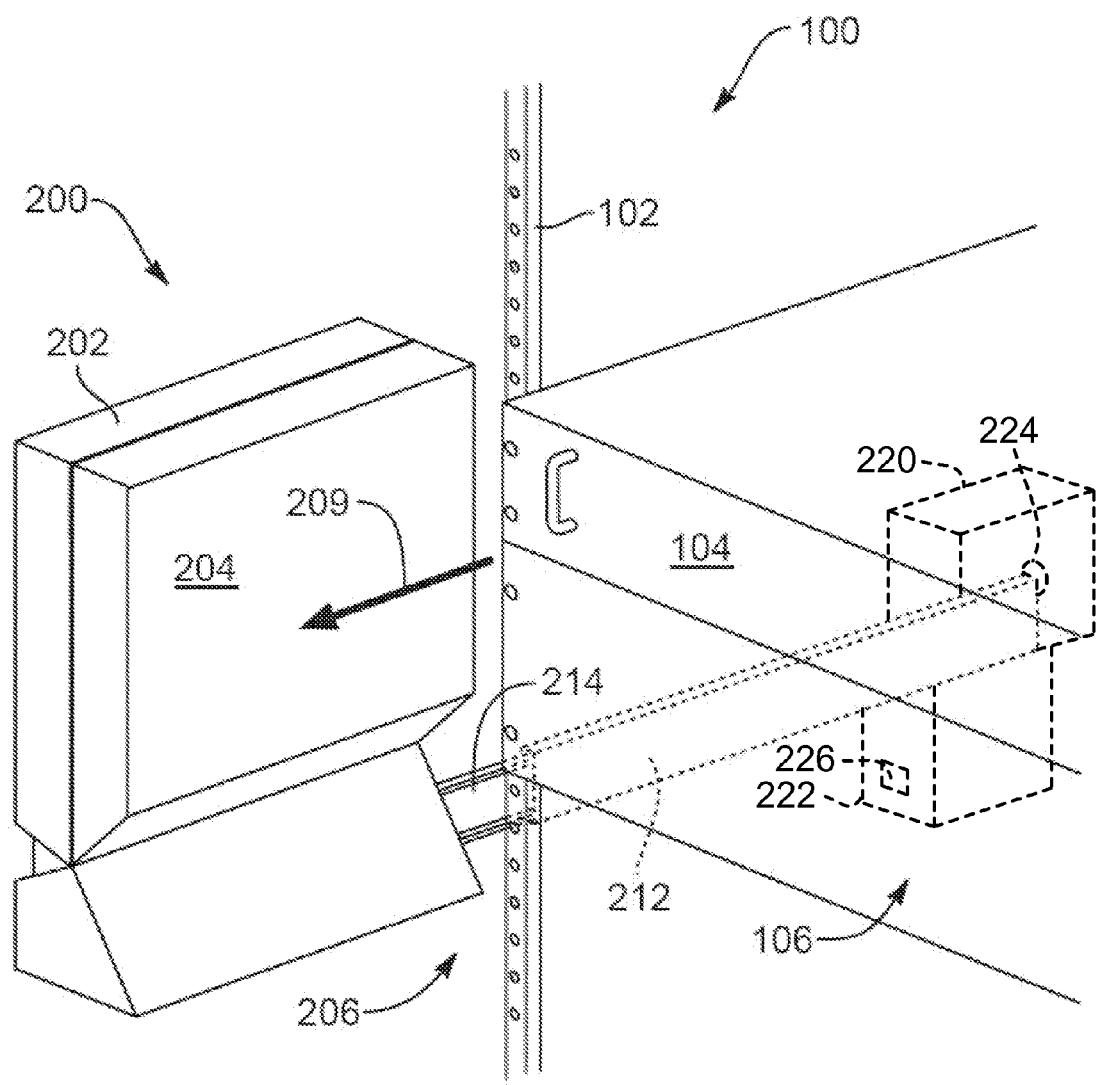
FIG. 2B is a perspective view illustrating one embodiment of an I/O service terminal station transitioning from a vertical storage position to an access position.
Figure 2C:
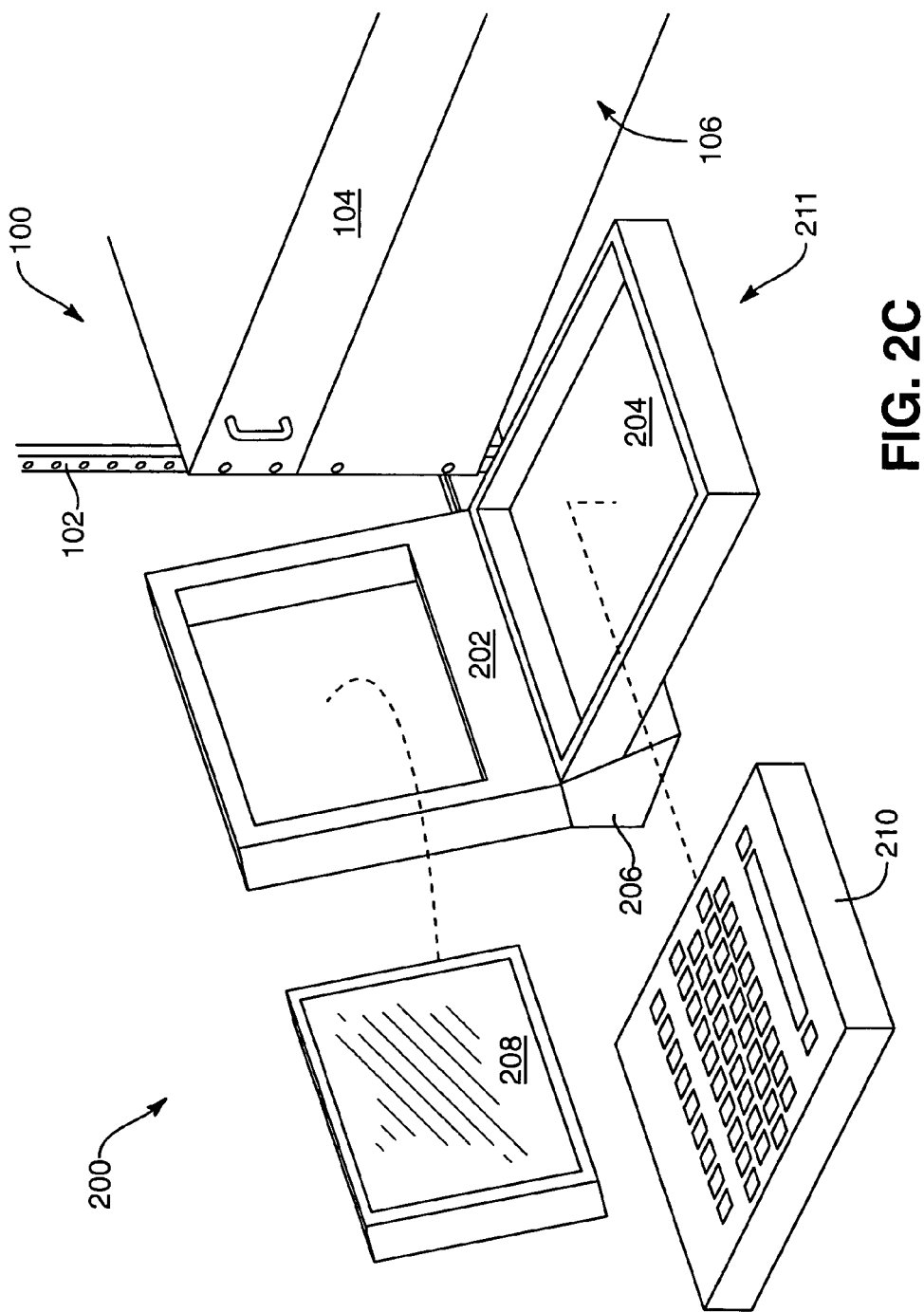
FIG. 2C is a perspective view illustrating one embodiment of an I/O service terminal station in an access position.

The lower support 204 accordingly may be configured to receive a second I/O device 210, for example, a human input device such as a keyboard (See FIG. 2C). Consequently, the supports 202, 204 may comprise I/O trays or an I/O service terminal station that permits a user to interface with computer equipment 104 stored within a frame 100. The supports 202, 204 may be made of any rigid material such as plastic or metal that sufficiently supports the I/O devices 208, 210 in both a vertical storage position 201 and an access position 211 (See FIG. 2C).

The mounting mechanism 206 may be mountable to a variety of structures. In one embodiment, the mounting mechanism 206 is configured to mount to the frame members 102 of a rack mount frame 100. Alternatively, the mounting mechanism 206 may be mounted to a cabinet or a divider panel 112 located between frames 100. In certain embodiments, the mounting mechanism 206 also connects the upper support 202 and the lower support 204. Additionally, the mounting mechanism 206 is configured to allow the supports 202, 204 to transition between a vertical storage position 201 and an access position 211.

In one embodiment, the mounting mechanism 206 may be connected to a frame 100 such that the vertical storage position 201 places the upper support 202 and lower support 204 behind the face 106 of the frame 100. As the supports 202, 204 transition from a storage position 201 to an access position 211, the supports 202, 204 move to a position in front of the face 106. The mounting mechanism 206 is configured to allow the transition from the storage position 201 to the access position 211.

FIG. 2B illustrates one embodiment of an I/O terminal 200 transitioning from a vertical storage position 201 to an access position 211. In one embodiment, the mounting mechanism 206 is configured to slide the I/O terminal 200 from the vertical storage position 201 to the access position 211 as represented by the arrow 209. The transition slidably positions the I/O terminal 200 in front of the face 106 of a support structure, such as the frame 100. For example, the mounting mechanism 206 may comprise a mounting bracket 212 connected to a pair of frame members 102. The mounting bracket 212 may be bolted to the frame member 102. A rail 214 may be connected to the I/O terminal 200 and slidably connected to the mounting bracket 212. The rail 214 may be extended to position the I/O terminal 200 in an access position 211 and retracted back alongside the mounting bracket 212 to place the I/O terminal 200 in a vertical storage position 201. Alternatively, the mounting mechanism 206 may also comprise rollers (not shown).

Those of skill in the art will recognize that the mounting mechanism 206 may employ a variety of different structures such as rails, rollers, ball bearings, and the like to provide slidable positioning of the I/O terminal 200 between the access position 211 and the vertical storage position 201. All of these various structures and arrangements are considered within the scope of the present invention.

Of course, a suitable motor 220, gearing 224, switch 226, and power supply 222 may be coupled to the mounting mechanism 206 such that transitioning the I/O terminal or I/O trays between a storage position 201 and an access position 211 is motorized. A motorized transition may be provided regardless of whether the transition is conducted by pivoting, sliding, telescoping, or the like.

FIG. 2C illustrates one embodiment of an I/O terminal 200 in an access position 211. The upper support 202 is configured to receive a first I/O device 208, and the lower support 204 is configured to receive a second I/O device 210. In certain embodiments, the first I/O device 208 comprises a display device, such as a flat panel LCD screen, and the second I/O device 210 comprises a human input device, such as a keyboard and/or an integrated pointing device. The I/O devices 208, 210 may be removable or interchangeable in certain embodiments. Alternatively, the I/O devices 208, 210 may be integrated with the upper support 202 and lower support 204.

The access position 211 may comprise the second support 204 at least partially in a non-vertical orientation. Additionally, the first support 202 may also be at least partially in a non-vertical orientation. Thus, a user may comfortably access the I/O devices 208, 210 when the I/O terminal 200 is in the access position 211.

In certain embodiments, the non-vertical orientation of the supports 202, 204 may be adjustable. In one embodiment, the second support 204 may pivot due to gravity to a substantially horizontal position parallel to the floor. In this manner, the second support 204 presents an installed I/O device 210 for comfortable use. In addition, the second support 204 may be used as a table. A user may place objects, such as a laptop, pens, papers, books, CDs, or the like, on the second support 202 in the access position 211. Yet, when the supports 202, 204 are in a vertical orientation, connected I/O devices 208, 210 may be compactly stored in a vertical position.

Figure 3A:
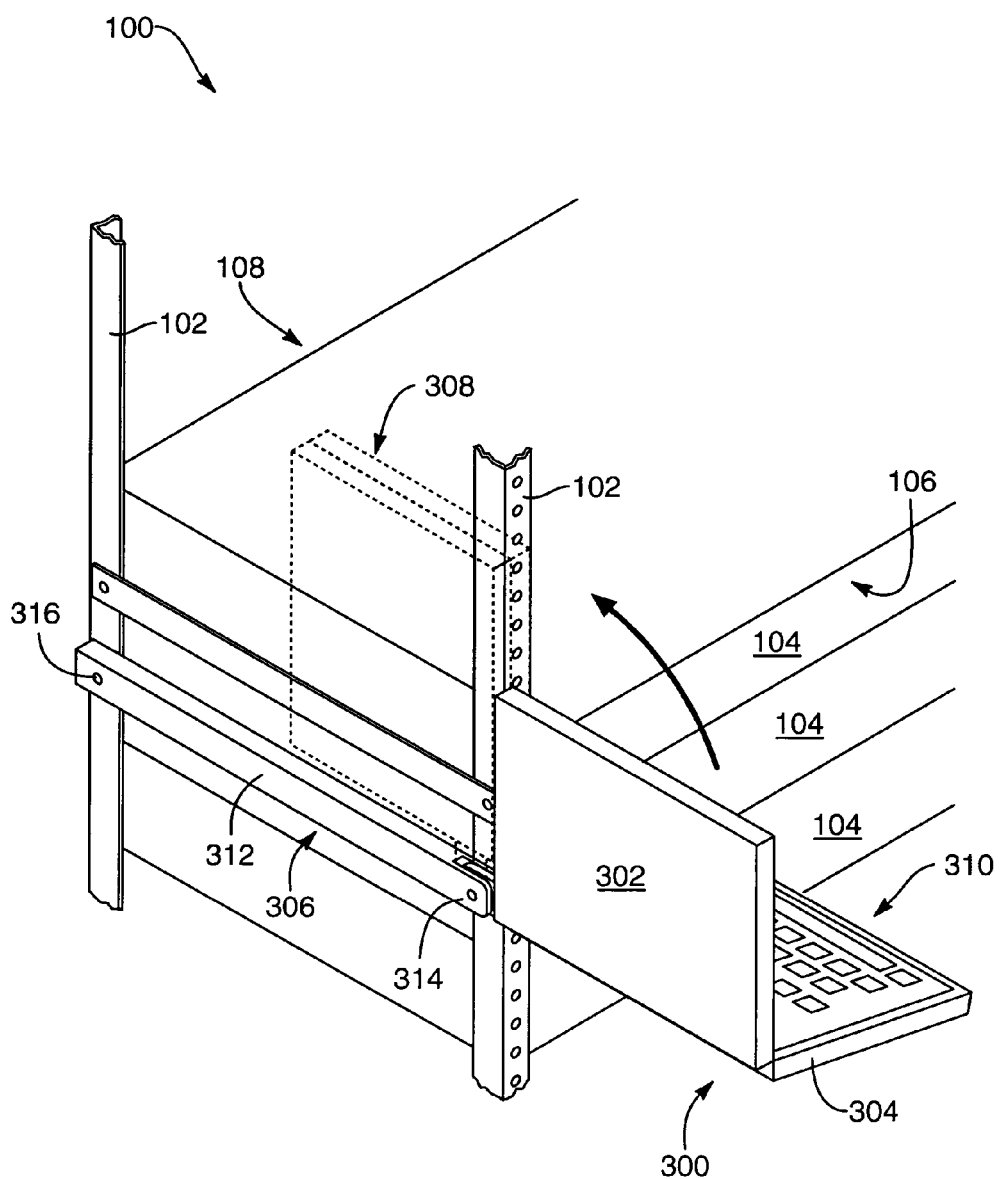
FIG. 3A is a perspective view illustrating one embodiment of an I/O service terminal station transitioning from an access position to a vertical storage position.

FIG. 3A illustrates an alternative embodiment of an I/O terminal 300 for vertically storing I/O devices. Similar to the I/O terminal 200 of FIGS. 2A-2C, the I/O terminal 300 has an upper support 302, a lower support 304, and a mounting mechanism 306.

The upper support 302 is pivotally connected to the lower support 304 such that the lower support 304 is pivotable between a substantially vertical position and a non-vertical position. A user may access the I/O devices by pivotally adjusting the lower support 304. The upper support 302 may be connected to the lower support 304 by a hinge (not shown). The hinge may permit the lower support 304 to pivot between two radial positions. Alternatively, the hinge may allow the lower support 304 to maintain a plurality of radial positions. Such hinges are well known and are often used in laptop computers to connect a display to a keyboard.

In one embodiment, the supports 302, 304 comprise I/O trays configured to receive an I/O device such as a display and/or keyboard. The I/O trays may include locking mechanisms (not shown) to temporarily secure a display and/or keyboard connected to the I/O trays. Alternatively, the I/O devices are integrated into an upper support 302 and a lower support 304.

In yet another embodiment, the present invention may comprise a single support such as a lower support 304 that transitions between a vertical position and a horizontal position to support a laptop computer configured to interface with computer equipment 104 of a rack mount frame 100. The lower support 304 may include suitable cabling and switches for readily connecting and disconnecting the laptop computer.

In the depicted embodiment, the upper support 302 may be stored adjacent to the lower support 304 in a vertical storage position 308. Consequently, the I/O terminal 300 is stored in a vertical storage position 308 perpendicular to the face 106 of the frame 100. Alternatively, the I/O terminal 300 may be stored in a vertical storage position 308 parallel to the face 106. Similarly, in an access position 310, a user may access the I/O devices, or supports 302, 304, while facing perpendicular to the face 106 of the rack mount frame 100. Or, in an alternative embodiment, a user may face parallel to the face 106 of the frame 100 to access the I/O devices, or supports 302, 304, when the I/O terminal 300 is in an access position 310.

Various embodiments of the mounting mechanism 306 allow for a combination of different storage positions 308 and access positions 310. Those of skill in the art will recognize a variety of hinges and multi-directional hinge components that may be used in the mounting mechanism 306 to provide a variety of vertical storage positions 308 and horizontal access positions 310 relative to a rack mount frame 100.

In one embodiment, the mounting mechanism 306 is configured to pivot such that the I/O terminal 300 transitions between an access position 310 and a vertical storage position 308. The mounting mechanism 306 may include a mounting bracket 312 and a hinge 314. The mounting bracket 312 may be secured to the frame members 102 by a fastener such as a nut and bolt. The mounting bracket 312 may comprise a planar metal piece with holes for bolts 316 which connect the mounting bracket 312 to the frame members 102.

The hinge 314 preferably connects the mounting bracket 312 to the I/O terminal 300. The hinge 314 connects the mounting bracket 312 to I/O terminal 300 such that opening the hinge 314 moves the I/O terminal 300 into a position substantially parallel to the frame member 102 (access position 310). Similarly, when the hinge 314 is closed, the I/O terminal 300 is positioned substantially perpendicular to the frame member 102 (vertical storage position 308). Preferably, the hinge 314 is made of metal such as stainless steel. Alternatively, the hinge 314 may comprise plastic or other rigid, sturdy material.

Figure 3B:
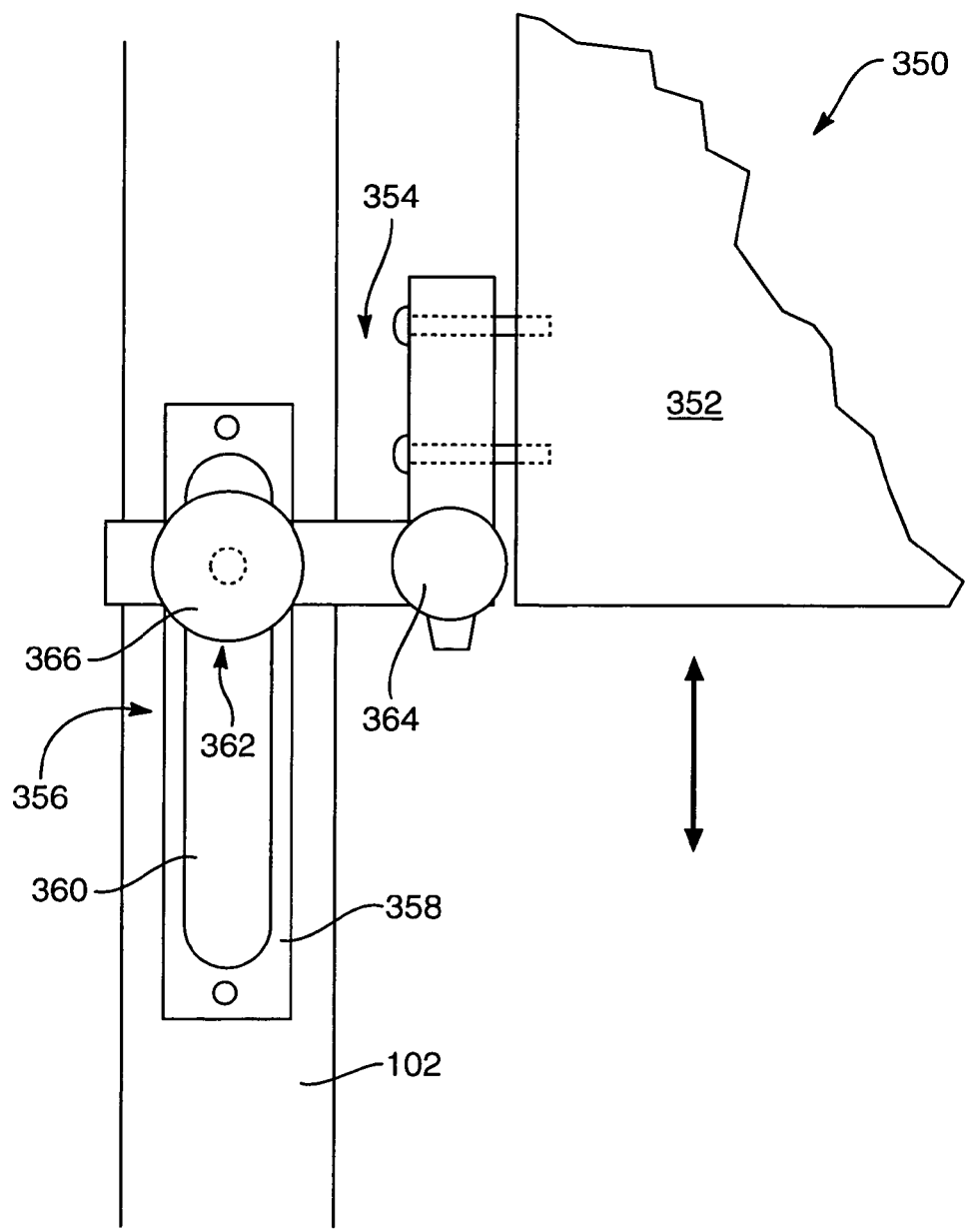
FIG. 3B is a side view illustrating one embodiment of an I/O service terminal station that is vertically adjustable.

FIG. 3B illustrates an alternative embodiment of an I/O terminal 350 for vertically storing I/O devices. The I/O terminal 350 similarly has an upper support 352, a lower support (not shown), and a mounting mechanism 354. In addition, I/O terminal 350 comprises a vertical adjustment mechanism 356 configured to connect the I/O terminal 350 to a rack mount frame 100 such that a user can adjust the height of the I/O terminal 350. The vertical adjustment mechanism 356 allows the upper support 352 and lower support to be vertically adjusted relative to the floor. Additionally, the vertical adjustment mechanism 356 may be implemented using a variety of different structures, all of which are considered within the scope of the present invention. Some examples may include, but are not limited to a rack and pinion, a spring-loaded locking clip, cables and binding clamps, friction clutches, worm screws, hinges, electric motors, hydraulic systems, etc.

The vertical adjustment mechanism 356 may be separate from, or integrated with, the mounting mechanism 354. In FIG. 3B, the vertical adjustment mechanism 356 is integrated with the mounting mechanism 354. A mounting bracket 358 extends substantially parallel to the frame member 102 and includes a slot 360.

The mounting mechanism 354 may, in one embodiment, include a screw and nut assembly 362. The screw and nut assembly 362 may secure the hinge 364 to the mounting bracket 358 within the slot 360. The screw may include a handle 366. By tightening the screw and nut assembly 362, a user may secure the mounting mechanism 354 vertically within the slot 360. To re-adjust the vertical position, a user loosens the screw and nut assembly 362, moves the mounting mechanism 354 and attached I/O terminal 350 to a new vertical position, and re-tightens the screw and nut assembly 362. Thus, the user may easily adjust the height of the I/O terminal 350 to a desired position.

Figure 4A:
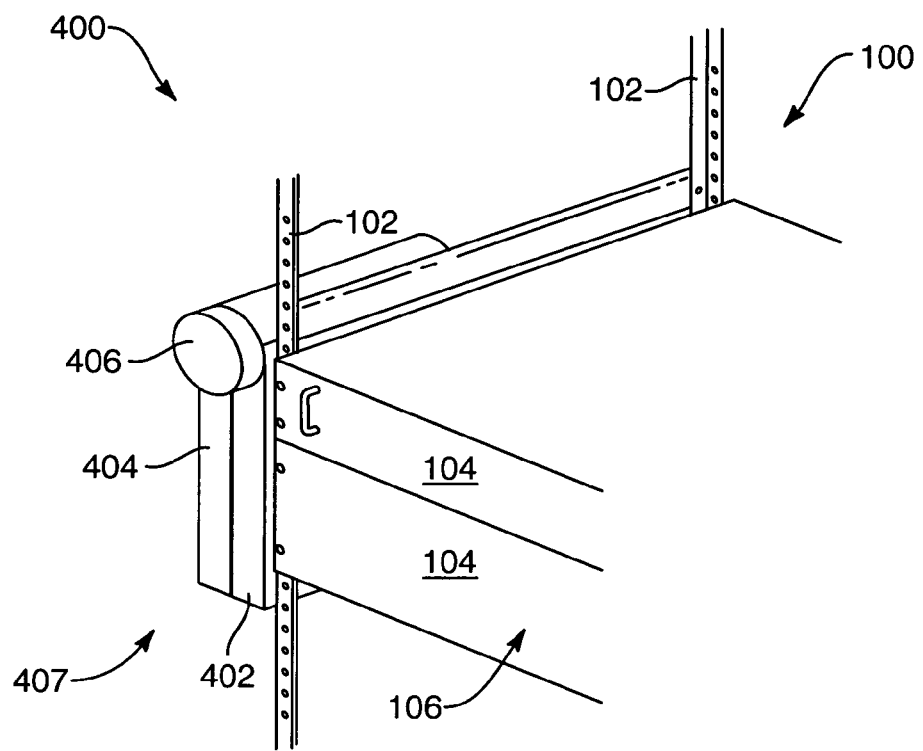
FIG. 4A is a perspective view illustrating one embodiment of an I/O service terminal station in a vertical storage position.
Figure 4B:
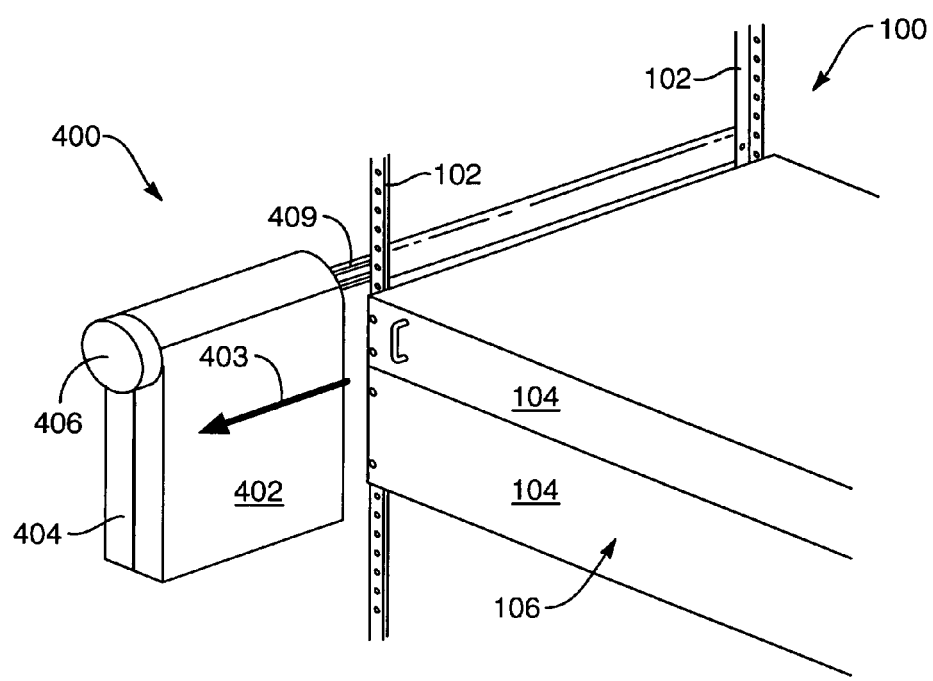
FIG. 4B is a perspective view illustrating one embodiment of an I/O service terminal station transitioning from a vertical storage position to an access position.
Figure 4C:
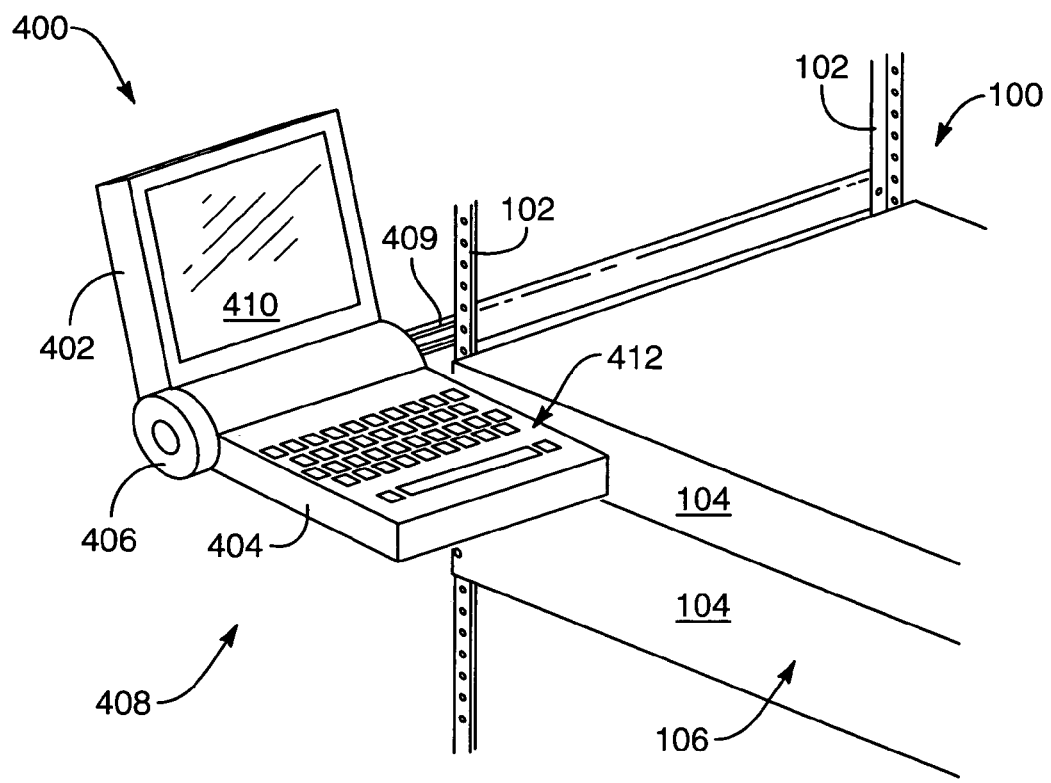
FIG. 4C is a perspective view illustrating one embodiment of an I/O service terminal station in an access position.

FIGS. 4A, 4B, and 4C illustrate an alternative embodiment of an I/O terminal 400 in accordance with the present invention. The I/O terminal 400 includes an upper support 402, a lower support 404, and a mounting mechanism 406 that pivotally connects the upper support 402 to the lower support 404. FIG. 4A illustrates the I/O terminal 400 in a vertical storage position 407. The upper support 402 and a lower support 404 may extend upward or downward from the mounting mechanism 406. In one embodiment, the mounting mechanism 406 connects the I/O terminal 400 to a rack mount frame 100.

FIG. 4B illustrates the I/O terminal 400 transitioning (indicated by arrow 403) from a vertical storage position 407 to an access position 408 (See FIG. 4C). In one embodiment, the mounting mechanism 406 may comprise a telescoping member 409 connected to the I/O terminal 400 and one or more frame members 102. The telescoping member 409 may include multiple different internal members that collapse and expand as needed to respectively position the I/O terminal 400 in the access position 408 and in the vertical storage position 407. Preferably, a user pulls and pushes on the I/O terminal 400 to respectively extend and collapse the telescoping member 409. Of course, a suitable motor, gearing, switch, and power supply may be coupled to the telescoping member 409 such that extension and retraction of the telescoping member 409 and I/O terminal 400 is motorized.

FIG. 4C illustrates an I/O terminal 400 fully extended and pivotally opened in an access position 408. The upper support 402 comprises an integrated flat display device 410, and the lower support 404 comprises an integrated human input device 412, such as a keyboard with a pointing device. In the access position 408, the supports 402, 404 may be adjusted to a plurality of positions to accommodate the user's preference in angles for a display device 410 and keyboard 412. Additionally, the I/O terminal 400 may include a vertical adjustment mechanism (not shown) to adjust the height of the I/O terminal 400 relative to the floor. Thus, a user may easily adjust the I/O terminal 400 to a preferred height without having to remove the I/O terminal from the rack mount frame 100. The present invention is also designed to allow all types of people, including the weak or disabled, to comfortably access the I/O devices.

In certain embodiments, the computing devices may be supported separately by apparatus in accordance with the present invention. For example, a display device may be mounted at eye level to a frame 100, while a human input device may be mounted at about hand level. Accordingly, both computing devices may be height adjustable. In addition, a mounting mechanism may be configured to allow the computing devices to be accessed at multiple angles relative to the face 106, the angles ranging from perpendicular to the face 106 to parallel with the face 106 of a frame 100.

Of course, a variety of I/O terminals or computing devices may be mounted to a single frame 100. In one embodiment, a touch screen display may be mounted to an apparatus in accordance with the present invention to allow a user to interface with the computer equipment 104.

In summary, the present invention provides an apparatus and system for vertically storing computing devices. The present invention conserves horizontal space available between the frame members 102 used by horizontally installed computer equipment 104. The present invention includes a mounting mechanism to permit the computing devices or I/O service terminal stations to readily transition between an access position and a vertical storage position. Furthermore, the present invention allows a user to position the computing devices or I/O terminal in a variety of vertical positions to accommodate the user.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus for compactly storing computing devices, comprising:
    an upper support comprising a rigid material forming a planar vertical back with substantially perpendicular edge protrusions along planar vertical back edges and configured to receive a display device;
    a lower support comprising a rigid material forming a tray configured to receive a keyboard and an integrated pointing device; and
    a mounting mechanism that connects the upper support to the lower support and allows the upper support and the lower support to transition between an access position and a vertical storage position, the mounting mechanism mounted to a divider panel of a computer equipment rack such that the vertical storage position is outside of the computer equipment rack and places the upper support and lower support behind a face of the computer equipment rack, wherein the computer equipment rack is configured to mount equipment with a height that is an integer multiple of 44.45 millimeters and the face is configured as a virtual vertical plane of the computer equipment rack wherein a user may access equipment mounted within the computer equipment rack.

2. The apparatus of claim 1, wherein the mounting mechanism pivotally connects the upper support to the lower support.

3. The apparatus of claim 1, wherein the mounting mechanism is configured to slide the upper support and lower support between the access position and the vertical storage position.

4. The apparatus of claim 1, wherein the mounting mechanism is configured to pivot the upper and lower support between the access position and the vertical storage position.

5. The apparatus of claim 1, further comprising a vertical adjustment mechanism configured to allow the upper support and lower support to be vertically adjusted to a plurality of vertical positions.

6. The apparatus of claim 1, wherein the access position comprises the lower support at least partially in a non-vertical orientation.

7. The apparatus of claim 1, wherein the access position comprises the upper support at least partially in a non-vertical orientation.

8. The apparatus of claim 1, further comprising a motor, gearing, switch, and power supply coupled to the mounting mechanism and configured to motorize the transition between the access position and the vertical storage position.

9. The apparatus of claim 1, wherein the mounting mechanism is mounted to a frame member of the computer equipment rack.

10. A system for compactly storing computing devices, comprising: a display device; a keyboard; an integrated pointing device; a computer equipment rack; an upper support comprising a rigid material forming a planar vertical back with substantially perpendicular edge protrusions along planar vertical back edges and configured to receive the display device; a lower support comprising a rigid material forming a tray configured to receive the keyboard and the integrated pointing device; and a mounting mechanism that connects the upper support to the lower support and allows the upper support and the lower support to transition between an access position and a vertical storage position, the mounting mechanism mounted to a divider panel of the computer equipment rack such that the vertical storage position is outside of the computer equipment rack and places the upper support and lower support behind a face of the computer equipment rack, wherein the computer equipment rack is configured to mount equipment with a height that is an integer multiple of 44.45 millimeters and the face is configured as a virtual vertical plane of the computer equipment rack wherein a user may access equipment mounted within the computer equipment rack.

11. The system of claim 10, wherein the mounting mechanism is configured to slide the upper support and lower support between the access position and the vertical storage position.

12. The system of claim 10, wherein the access position comprises the lower support at least partially in a non-vertical orientation.

13. The system of claim 10, wherein the access position comprises the upper support at least partially in a non-vertical orientation.

* * * * *